(12) United States Patent
Yang et al.

(10) Patent No.: US 9,620,540 B1
(45) Date of Patent: Apr. 11, 2017

(54) IMAGE SENSOR INCLUDING VERTICAL TRANSFER GATE

(71) Applicant: SK hynix Inc., Gyeonggi-do (KR)

(72) Inventors: Yun-Hui Yang, Gyeonggi-do (KR);
Pyong-Su Kwag, Gyeonggi-do (KR);
Young-Jun Kwon, Gyeonggi-do (KR);
Min-Ki Na, Gyeonggi-do (KR);
Sung-Kun Park, Gyeonggi-do (KR);
Donghyun Woo, Gyeonggi-do (KR);
Cha-Young Lee, Gyeonggi-do (KR);
Ho-Ryeong Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/019,625

(22) Filed: Feb. 9, 2016

(30) Foreign Application Priority Data

Dec. 4, 2015 (KR) .......................... 10-2015-0172319

(51) Int. Cl.
    *H01L 27/146* (2006.01)
(52) U.S. Cl.
    CPC .. *H01L 27/14616* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| 9,520,427 | B1* | 12/2016 | Yoo | H01L 27/14616 |
| 2016/0043126 | A1* | 2/2016 | Fan | H01L 27/14643 |
| | | | | 257/226 |
| 2016/0343751 | A1* | 11/2016 | Sze | H01L 27/1464 |

* cited by examiner

*Primary Examiner* — Ali Naraghi
(74) *Attorney, Agent, or Firm* — I P & T Group LLP

(57) ABSTRACT

An image sensor includes a photoelectric conversion element including a first impurity region and a second impurity region, wherein the first impurity region contacts a first surface of a substrate, wherein the second impurity region has conductivity complementary to the first impurity region and is formed in the substrate and below the first impurity region; a pillar formed over the photoelectric conversion element; a transfer gate formed over the photoelectric conversion element to surround the pillar; and a channel layer formed between the transfer gate and the pillar and contacting the photoelectric conversion element, wherein the channel layer contacts the first impurity region and has the same conductivity as the second impurity region.

11 Claims, 11 Drawing Sheets

IMAGE SENSOR INCLUDING VERTICAL TRANSFER GATE

CROSS-REFERENCE TO RELATED APPLICATIONS

The present application claims priority of Korean Patent Application No. 10-2015-0172319 filed on Dec. 4, 2015, which is herein incorporated by reference in its entirety.

BACKGROUND

Exemplary embodiments of the present invention relate to a semiconductor device manufacturing technology, and more particularly, to an image sensor including a vertical transfer gate.

An image sensor converts an optical image into an electrical signal. Recently, due to the development of the computer industry and the communication industry, a demand for an image sensor with improved performance has increased for various devices, such as digital cameras, camcorders, PCS (Personal Communication System), game machines, security cameras, medical micro-cameras, and robots.

SUMMARY

Various embodiments are directed to an image sensor having improved performance.

In an embodiment, an image sensor may include a photoelectric conversion element including a first impurity region and a second impurity region, wherein the first impurity region contacts a first surface of a substrate, wherein the second impurity region has conductivity complementary to the first impurity region and is formed in the substrate and below the first impurity region; a pillar formed over the photoelectric conversion element; a transfer gate formed over the photoelectric conversion element to surround the pillar; and a channel layer formed between the transfer gate and the pillar and contacting the photoelectric conversion element, wherein the channel layer contacts the first impurity region and has the same conductivity as the second impurity region.

Furthermore, the image sensor according to an embodiment may further include a color filter layer formed over an incident surface of the substrate, wherein the incident surface of the substrate is opposite to the first surface of the substrate, wherein an incident light is introduced through the color filter layer and travels to the photoelectric conversion element; and a light condensing member formed over the color filter layer.

The first impurity region may surround the second impurity region. The first impurity region may include a first portion contacting the channel layer and a second portion except for the first portion, and the first portion may have a thickness smaller than that of the second portion. The second impurity region may have a gradient doping profile so that a doping concentration of the second impurity region gradually increases along a carrier transport direction. The pillar may be a polygon pillar, a round pillar, or an oval pillar. The pillar may have a vertical sidewall, an inclined sidewall, or an unevenly-shaped sidewall. The pillar may include an insulating material. The channel layer may overlap the entire photoelectric conversion element. The channel layer may include doped polysilicon. The transfer gate may include an opening exposing the channel layer.

In an embodiment, an image sensor may include a photoelectric conversion element formed in a substrate; a transfer gate formed over the photoelectric conversion element and having a through hole passing through the transfer gate; a floating diffusion layer formed over the transfer gate; and a channel layer gap-filling the through hole, electrically coupling the photoelectric conversion element to the floating diffusion layer in response to a signal applied to the transfer gate, and being operated in a depletion mode; and a capacitor formed over the floating diffusion layer.

Furthermore, the image sensor according to an embodiment may further include an Interlayer dielectric layer formed over the substrate and covering the transfer gate, the floating diffusion layer, and the capacitor; a logic circuit layer formed over the Interlayer dielectric layer; and contacts passing through the Interlayer dielectric layer and electrically coupling each of the transfer gate, the floating diffusion layer and the capacitor to the logic circuit layer.

The photoelectric conversion element may include a first, a second, and a third impurity region formed over the substrate, wherein the first and the third impurity regions have the same conductivity as each other, wherein the second impurity region has conductivity complementary to the first impurity region, wherein the first impurity region surrounds the second impurity region, and wherein the third impurity region is interposed between the channel layer and the second impurity region. The channel layer may have the same conductivity as the second impurity region. The third impurity region may have a thickness smaller than that of the first impurity region contacting the transfer gate. The second impurity region may have a gradient doping profile so that a doping concentration increases along a carrier transport direction. The transfer gate may include a gate electrode; and a gate dielectric layer surrounding the gate electrode. The gate dielectric layer may include a first gate dielectric layer formed between the gate electrode and the photoelectric conversion element; a second gate dielectric layer formed between the gate electrode and the floating diffusion layer; and a third gate dielectric layer formed between the gate electrode and the channel layer. Each of the first gate dielectric layer and the second gate dielectric layer may include a low-k material, and wherein the third gate dielectric layer may include a high-k material. The capacitor may include a stack of a first electrode, a dielectric layer, and a second electrode, and wherein the first electrode may include the floating diffusion layer.

DETAILED DESCRIPTION

Figure 1:
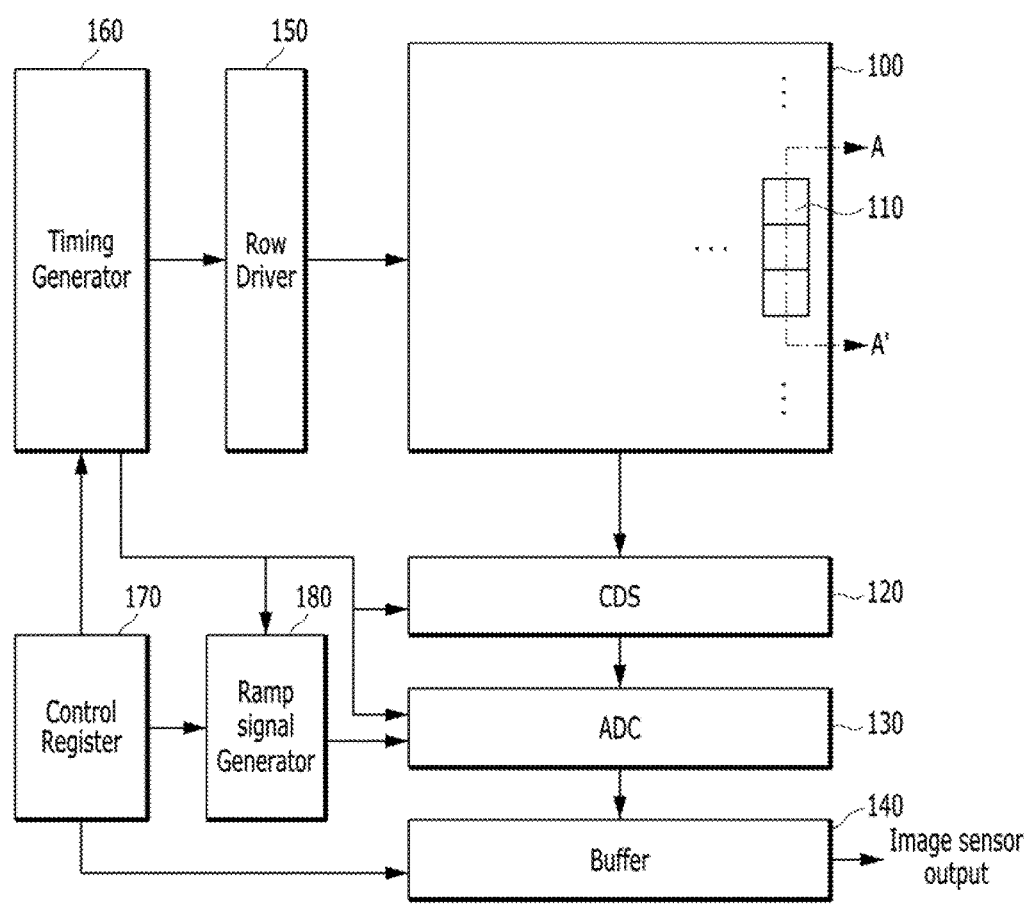
FIG. 1 is a block diagram schematically illustrating an image sensor in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated to clearly illustrate features of the embodiments. When a first layer is referred to as being "on" a second layer or "on" a substrate, it not only refers to a case in which the first layer is formed directly on the second layer or the substrate but also a case in which a third layer exists between the first layer and the second layer or the substrate.

The following embodiments of the present invention provide an image sensor having improved performance and a method for fabricating the same. The image sensor having improved performance means an image sensor capable of providing a high resolution image. Since an Image sensor including a plurality of highly integrate pixels is required to provide a high resolution image, in the image sensor in accordance with the embodiments, each of a plurality of pixels may include a transfer transistor including a vertical transfer gate, and have a shape in which the transfer transistor and a photoelectric conversion element are stacked.

FIG. 1 is a block diagram schematically illustrating an image sensor in accordance with an embodiment of the present invention.

As illustrated in FIG. 1, the image sensor may include a pixel array 100, a correlated double sampling (CDS) unit 120, an analog-digital converter (ADC) 130, a buffer 140, a row driver 150, a timing generator 160, a control register 170, and a ramp signal generator 180. The pixel array 100 may include a plurality of unit pixels 110 arranged in a matrix.

The timing generator 160 may generate one or more control signals for controlling the row driver 150, the CDS unit 120, the ADC 130, and the ramp signal generator 180. The control register 170 may generate one or more control signals for controlling the ramp signal generator 180, the timing generator 160, and the buffer 140.

The row driver 150 may drive the pixel array 100 row by row. For example, the row driver 150 may generate a select signal for selecting any one row line of a plurality of row lines. Each of the unit pixels 110 may sense incident light and output an image reset signal and an image signal to the CDS unit 120 through a column line. The CDS unit 120 may perform sampling in response to the image reset signal and the image signal.

The ADC 130 may compare a ramp signal outputted from the ramp signal generator 180 with a sampling signal outputted from the CDS unit 120, and output a comparison signal. According to a clock signal provided from the timing generator 160, the ADC 130 may count the level transition time of the comparison signal, and output the count value to the buffer 140. The ramp signal generator 180 may operate under control of the timing generator 160.

The buffer 140 may store a plurality of digital signals outputted from the ADC 130 then sense and amplify the digital signals. Thus, the buffer 140 may include a memory (not illustrated) and a sense amplifier (not illustrated). The memory may store count values. The count values may represent signals outputted from the plurality of unit pixels 110. The sense amplifier may sense and amplify the count values outputted from the memory.

In order to provide a high resolution image, the number of unit pixels 110 integrated in a pixel array 100 should be inevitably increased. That is, more unit pixels 110 should be disposed in a limited area, and thus a physical size of unit pixel 110 should be decreased. However, since the image sensor operates on a basis of a pixel signal generated by each unit pixel in response to an incident light, characteristics of the unit pixel 110 are deteriorated when the physical size of unit pixel 110 is decreased.

Therefore, in a following embodiment in accordance with the present invention, an image sensor capable of facilitating high integration and preventing deterioration of characteristics due to an increase in integration degree will be described in detail with reference to the drawings.

Figure 2:
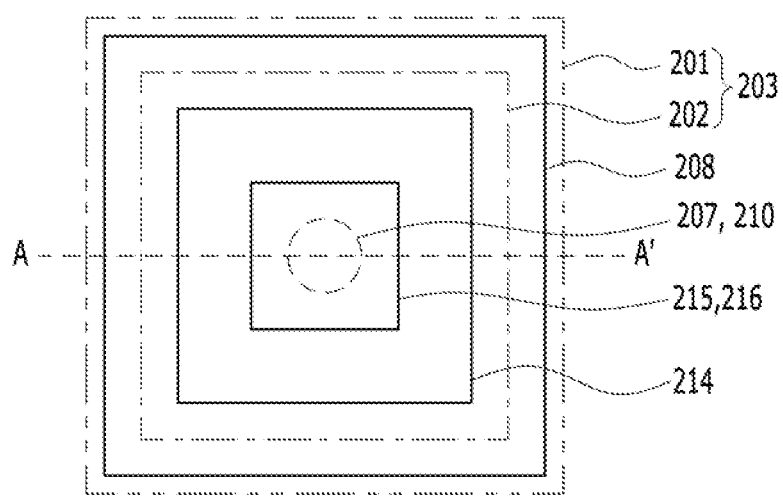
FIG. 2 is a plan view illustrating an image sensor in accordance with an embodiment of the present invention.
Figure 3:
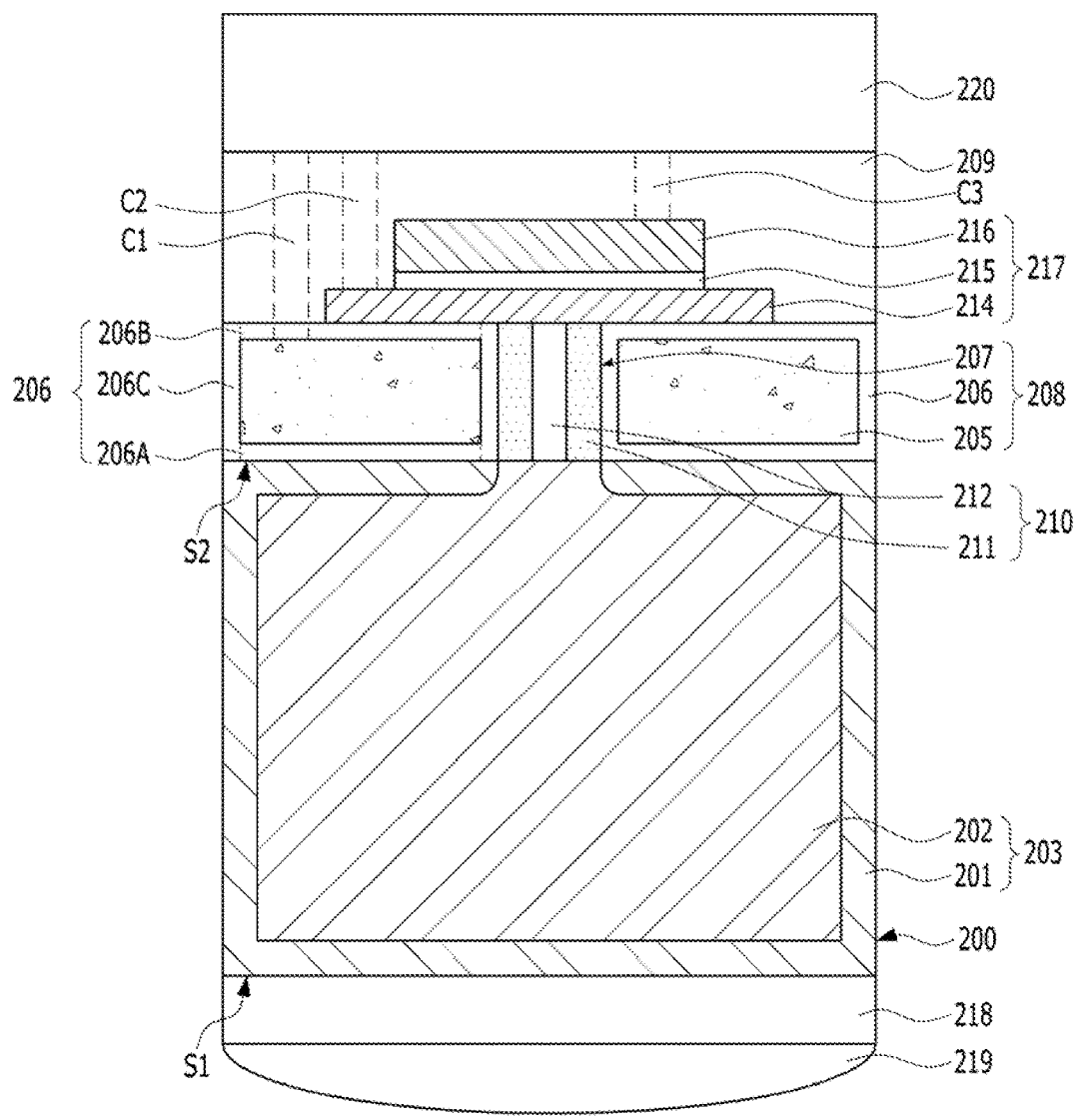
FIG. 3 is a cross-sectional view illustrating an image sensor in accordance with an embodiment of the present invention and taken along the line A-A' shown in FIG. 2.
Figure 4:
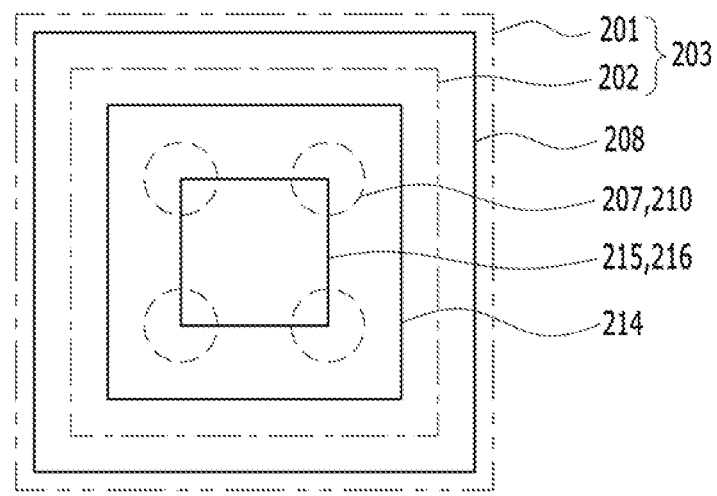
FIG. 4 is a plan view illustrating an image sensor in accordance with an embodiment of the present invention.
Figure 5A:
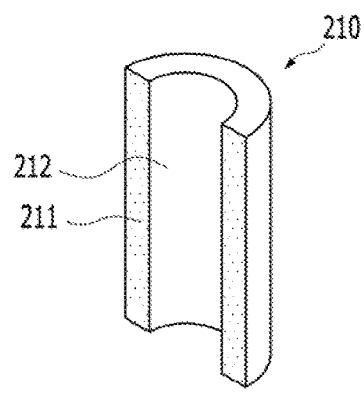
FIGS. 5A to 5C are perspective views illustrating a channel structure applicable to an image sensor in accordance with an embodiment of the present invention.
Figure 5B:
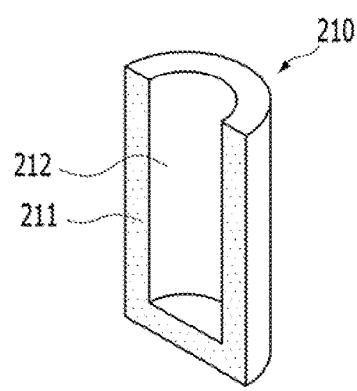
Figure 5C:
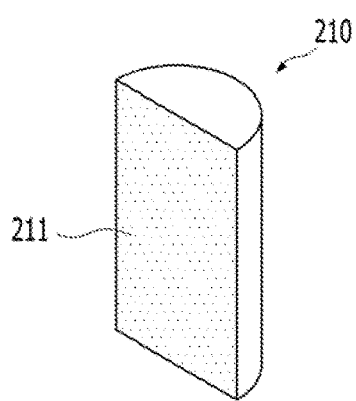

FIG. 2 is a plan view illustrating an image sensor in accordance with an embodiment of the present invention. FIG. 3 is a cross-sectional view taken along the line A-A' shown in FIG. 2. FIG. 4 is a plan view illustrating an image sensor in accordance with another embodiment of the present invention. FIGS. 5A to 5C are perspective views illustrating a channel structure applicable to an image sensor in accordance with an embodiment of the present invention.

As shown in FIGS. 2 and 3, an image sensor in accordance with an embodiment may include a photoelectric conversion element 203 formed in a substrate 200, a transfer gate 208 formed over the photoelectric conversion element 203 and having one or more through holes 207 passing through the transfer gate 208, a floating diffusion layer 214 formed over the transfer gate 208, a channel structure 210 gap-filling each of the through holes 207 and electrically coupling the photoelectric conversion element 203 to the floating diffusion layer 214 in response to a signal applied to the transfer gate 208, and a capacitor 217 formed over the floating diffusion layer 214.

Moreover, the image sensor may include an Interlayer dielectric layer 209 formed over the substrate 200 and covering the transfer gate 208, the floating diffusion layer 214 and a capacitor 217, a logic circuit layer 220 formed over the interlayer dielectric layer 209 and contacts C1, C2 and C3 passing through the interlayer dielectric layer 209 and electrically coupling each of the transfer gate 208, the floating diffusion layer 214 and the capacitor 217 to the logic circuit layer 220. Further, the image sensor may include a color filter layer 218 located opposite to the transfer gate 208 and formed over an incident surface S1 through which incident light is introduced and travels into the photoelectric conversion element 203, and a light condensing member 219 formed over the color filter layer 218.

Hereinafter, each of the components will be described in detail. The image sensor in accordance with the embodiment of the present invention may include the photoelectric conversion element 203 formed in the substrate 200. The substrate 200 may include a semiconductor substrate. The semiconductor substrate may be in a single crystal state and include a silicon-containing material. That is, the substrate 200 may include a single crystal silicon-containing material. The substrate 200 may be a thin substrate obtained by a thinning process. For example, the substrate 200 may be a thin bulk silicon substrate obtained by a thinning process.

The photoelectric conversion element 203 may include a photodiode. Specifically, the photoelectric conversion element 203 may include a first impurity region 201 and a second impurity region 202 having a conductivity type complementary to the first impurity region 201 and contacting a channel structure 210. The second impurity region 202 may be formed in the first impurity region 201. Thus, the first impurity region 201 may surround the second impurity region 202, and a portion of the second impurity region 202 may pass through the first impurity region 201 to contact the channel structure 210. The first impurity region 201 may be a P-type, and the second impurity region 202 may be an N-type.

In a vertical direction, the second impurity region 202 may have either a uniform doping profile or a gradient profile in which an impurity concentration is gradually increased according to a carrier transfer direction. In case of the latter, photo-charges generated by the photoelectric conversion element 203 may be more effectively transferred to the transfer gate 208. Here, a carrier transfer direction of the transfer gate 208 is the direction facing the incident surface S1. The image sensor in accordance with the embodiment of the present invention may include the color filter layer 218 formed over the incident surface S1 of the substrate 200, and the light condensing member 219 formed over the color filter layer 218. The color filter layer 218 may serve to separate colors and include a red filter, a green filter, a blue filter, a cyan filter, a yellow filter, a magenta filter, a white filter, a black filter, an IR cutoff filter, etc. The light condensing member 219 may include a digital lens or a hemispherical lens.

The image sensor in accordance with the embodiment of the present invention may include the transfer gate 208 formed over the photoelectric conversion element 203. The transfer gate 208 formed over the substrate 200 where the photoelectric conversion element 203 is formed may have a flat plate shape and overlap the photoelectric conversion element 203. That is, the transfer gate 208 may have a flat plate shape and is formed corresponding to each unit pixel.

As such, since the photoelectric conversion element 203 and the transfer gate 208 are stacked in a vertical direction, an integration degree may be increased. The transfer gate 208 may be formed over a surface S2 which is located opposite to the incident surface. Accordingly, the transfer gate 208 may function as a back reflective layer with respect to the photoelectric conversion element 203. In this case, the photoelectric conversion element 203 may increase quantum efficiency.

Moreover, the transfer gate 208 may include one or more through hole 207 passing through the transfer gate 208. The channel structure 210 gap-fills the through hole 207. A planar shape of the through hole 207 may be a polygon having three sides or more, a circle, or ellipse. Therefore, the channel structure 210 gap-filling the through hole 207 may have a polygonal column shape having three sides or more, a circular column shape, a ring-type column shape, or a cylinder shape.

As shown in FIG. 2, the transfer gate 208 may have a single through hole 207. In this case, the through hole 207 may be disposed in a central portion of the transfer gate 208. In another embodiment, as shown in FIG. 4, the transfer gate 208 may have a plurality of through holes 207, and the plurality of through holes 207 may be disposed in the transfer gate 208 in a matrix shape. A planar shape of each of the plurality of through holes 207 may be the same as or different from each other.

Further, the transfer gate 208 may include a gate electrode 205 and a gate dielectric layer 206 formed on all surfaces of the gate electrode 205 so as to seal the gate electrode 205. That is, the gate electrode 205 may be insulated from adjacent structures such as the photoelectric conversion element 203, the floating diffusion layer 214, etc. by the gate dielectric layer 206. The gate electrode 205 may include a semiconductor material including silicon or a metallic material.

The gate dielectric layer 206 surrounding the gate electrode 205 may have a uniform thickness. That is, a first gate dielectric layer 206A disposed between the photoelectric conversion element 203 and the gate electrode 205, a second gate dielectric layer 206B disposed between the gate electrode 205 and the floating diffusion layer 214, and a third gate dielectric layer 206C formed on sidewalls of the gate electrode 205 may have the same thickness as each other.

The first gate dielectric layer 206A, the second gate dielectric layer 206B and the third gate dielectric layer 206C may be formed of the same material as each other. For example, each of the first gate dielectric layer 206A, the second gate dielectric layer 206B and the third gate dielectric layer 206C may include a high-K material. Herein, the 'high-K' material means a material with a dielectric constant higher than silicon oxide.

The image sensor in accordance with the embodiment of the present invention may include the channel structure 210 passing through the transfer gate 208 and electrically coupled to the photoelectric conversion element 203. The channel structure 210 may gap-fill the through hole 207 of the transfer gate 208. Accordingly, the channel structure 210 may have a column shape. For reference, the channel structure 210 described with reference to FIGS. 5A to 5C may be applied to other embodiments.

Specifically, as shown in FIGS. 3 and 5A, the channel structure 210 may include a channel layer 211 formed on sidewalls of the through hole 207 and having a ring-type column shape, and a sealing layer 212 gap-filling a remaining through hole 207. The ring-type column shape may facilitate channel layer 211 to be fully depleted in an off-state. Thus, it is possible to improve gate controllability of the transfer gate 208. For example, the off-state means an equilibrium state in which any bias is not applied to the transfer gate 208.

Moreover, as shown in FIG. 5B, the channel structure 210 may include the channel layer 211 formed on sidewalls and a bottom surface of the through hole 207 and having a cylinder shape, and the sealing layer 212 gap-filling a remaining through hole 207. The channel layer 211 having a cylinder shape may have a line width sufficient for full depletion in an off-state so that gate controllability of the transfer gate 208 may be improved. Furthermore, an area in which the photoelectric conversion element 203 contacts the channel layer 211 may be increased so that a channel resistivity may be decreased.

Furthermore, the channel structure 210 may include the sealing layer 212 spaced from sidewalls of the through hole 207 and formed in the through hole 207 and the channel layer 211 formed on sidewalls and over a bottom of the through hole 207 and having a reversed-cylinder shape. That is, in the channel layer 211, a surface having a relatively large contact area contacts the floating diffusion layer 214 and a surface having a relatively small contact area contacts the photoelectric conversion element.

In addition, as shown in FIG. 5C, the channel structure 210 may include the channel layer 211 having a column shape and gap-filling the through hole 207. The channel layer 211 having a column shape may be formed by a simple process and have a line width sufficient for full depletion of a channel in an off-state.

In the channel structure 210 described above, the channel layer 211 may include a silicon-containing material. For example, the channel layer 211 may include polysilicon. Specifically, the channel layer 211 may include undoped polysilicon which is not doped with any impurity or a P-type polysilicon which is doped with a P-type impurity.

In this case, the transfer transistor may be operated in an enhancement mode. Moreover, the channel layer 211 may include polysilicon doped with an N-type impurity. In this case, the transfer transistor may be operated in a depletion mode and improve a dark current characteristic in an off-state. The sealing layer 212 may include an Insulating material. For example, the sealing layer 212 may include oxide, nitride, oxynitride, or a combination thereof.

The image sensor in accordance with the embodiment of the present invention may include the floating diffusion layer 214 formed over the transfer gate 208. A photocharge generated from the photoelectric conversion element 203 in response to an incident light is stored in the floating diffusion layer 214. The floating diffusion layer 214 may be electrically coupled to one or more channel structures 210 passing through the transfer gate 208. That is, the floating diffusion layer 214 may overlap one or more of the through holes 207. The floating diffusion layer 214 may have a flat plate shape and overlap the transfer gate 208 to provide a sufficient storage space, that is, sufficient capacitance.

Here, an area of the floating diffusion layer 214 may be smaller than that of the transfer gate 208. This is to provide a space for forming a first contact C1 coupled to the transfer gate 208. The floating diffusion layer 214 may include a semiconductor material including silicon or a metallic material. For example, the floating diffusion layer 214 may include polysilicon doped with a second conductivity type impurity, that is, an N-type impurity.

The image sensor in accordance with the embodiment of the present invention may include a second electrode 216 formed over the floating diffusion layer 214. The second electrode 216 may have a flat plate shape overlapping the floating diffusion layer 214 and have a smaller area than the floating diffusion layer 214. A dielectric layer 215 is interposed between two electrodes, that is, the floating diffusion layer 214 and a second electrode 216.

The floating diffusion layer 214 and the second electrode 216 may also be referred to as first and second electrodes. The floating diffusion layer 214, a second electrode 216, and the dielectric layer 215, in combination, form the capacitor 217. Any one of the two electrodes, for example, the first electrode may include the floating diffusion layer 214. Accordingly, the dielectric layer 215 and the second electrode 216 may have a smaller area than the floating diffusion layer 214. This is to provide a space for forming a second contact C2 coupled to the floating diffusion layer 214.

Moreover, the capacitor 217 may serve to further increase capacitance of the floating diffusion layer 214. Also, the capacitor 217 may serve to improve an operation characteristic of the floating diffusion layer 214. Furthermore, the second electrode 216 of the capacitor 217 may be coupled to a third contact C3 capable of applying a bias. In an embodiment, to improve a characteristic of the floating diffusion layer 214 by using the capacitor 217, when the floating diffusion layer 214 is reset before integration time, the floating diffusion layer 214 should be charged with charges corresponding to an initial voltage input through a reset transistor.

When the initial voltage does not supply a sufficient current or the initial voltage is not supplied to the floating diffusion layer 214 for a sufficient period of time, the floating diffusion layer 214 may not be completely reset. In this case, the floating diffusion layer 214 may be completely reset by applying an initialization voltage to the second electrode 216 of the capacitor 217 through the third contact C3. The initialization voltage may be applied after the reset transistor is activated and before the transfer transistor is activated.

The image sensor in accordance with the embodiment of the present invention may include the interlayer dielectric layer 209 and the logic circuit layer 220. The interlayer dielectric layer 209 covers the transfer gate 208, the floating diffusion layer 214 and the capacitor 217. The logic circuit layer 220 is formed over the interlayer dielectric layer 209. The interlayer dielectric layer 209 may be a single layer or a stacked layer including any one or more of oxide, nitride, and oxynitride.

The logic circuit layer 220 may include a signal processing circuit processing a pixel signal generated in pixels in response to incident light. Although it is not shown in drawings, the signal processing circuit may include a correlated double sampling 120, an analog-digital converter 130, a buffer 140, a row driver 150, a timing generator 160, a control register 170, a lamp signal generator 180, etc. See FIG. 1.

Furthermore, the signal processing circuit may include a plurality of transistors, multi-layered lines, a multi-layered interlayer dielectric layer 209 and a plurality of plugs coupling them to each other. Moreover, the logic circuit layer 220 may include an application processor (AP) including an image processing, etc. in addition to the signal processing circuit. For example, the logic circuit layer 220 may include an image signal processor (ISP).

Further, the logic circuit layer 220 may be formed in a wafer bonding process. The logic circuit layer 220 is bonded to the multi-layered interlayer dielectric layer 209. Accordingly, the logic circuit layer 220 may include a plurality of layers and have a stack structure in which logic circuits for signal processing are stacked through a wafer bonding process, thereby improving an integration degree of the image sensor.

The image sensor in accordance with the embodiment of the present invention described above may facilitate high integration without deterioration of characteristics.

Hereinafter, some modifications of the image sensor in accordance with the first embodiment of the present invention described above will be described with reference to FIGS. 6 and 7. For reference, FIGS. 6 and 7 are cross-sectional views taken along the line A-A' shown in FIG. 2 and the same elements shown in FIG. 3 are assigned the same reference numerals for convenience.

Figure 6:
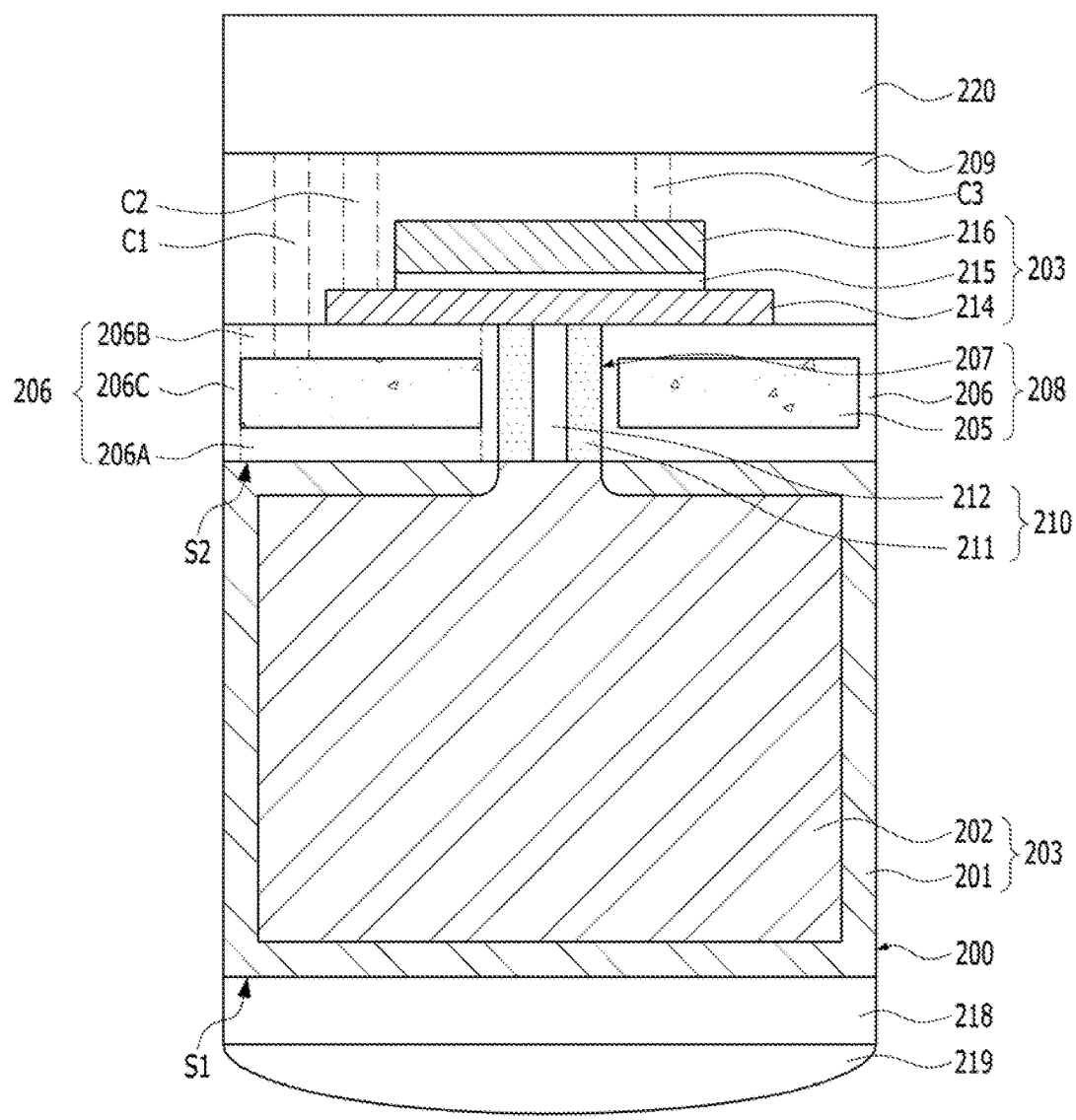
FIG. 6 is a cross-sectional view illustrating an image sensor in accordance with another embodiment of the present invention.
Figure 7:
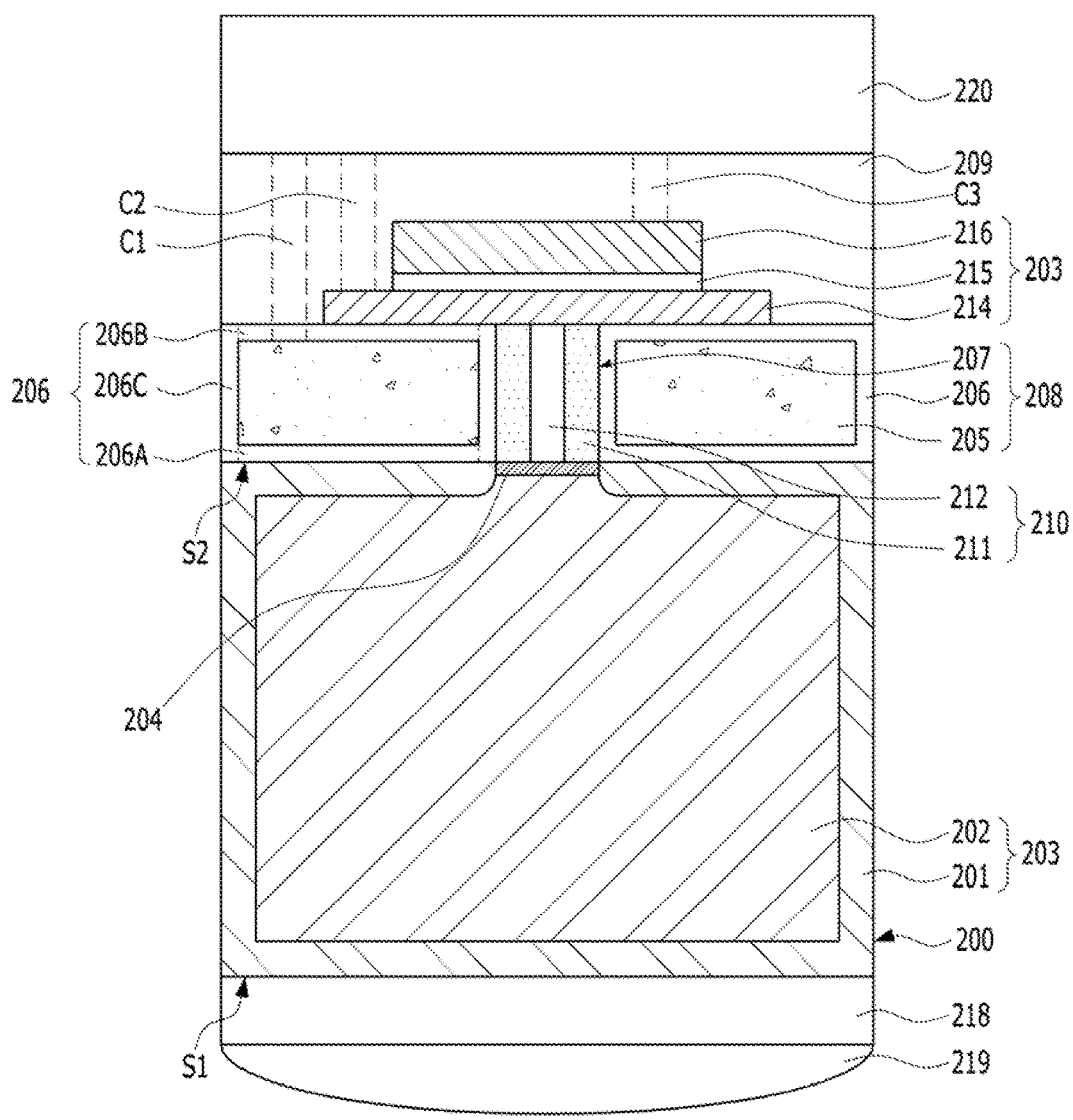
FIG. 7 is a cross-sectional view an image sensor in accordance with another embodiment of the present invention.

FIG. 6 is a cross-sectional view illustrating an image sensor in accordance with another embodiment of the present invention. As shown in FIG. 6, in the image sensor in accordance with another embodiment of the present invention, a transfer gate 208 may include a gate dielectric layer 206 and a gate electrode 205 sealed by the gate dielectric layer 206. The gate dielectric layer 206 may include a first gate dielectric layer 206A, a second dielectric layer 206B and a third gate dielectric layer 206C. Here, the first gate dielectric layer 206A, the second dielectric layer 206B and the third gate dielectric layer 206C may have different thicknesses from each other and include different materials from each other.

Specifically, the first gate dielectric layer 206A and the second gate dielectric layer 206B may have a larger thickness than the third gate dielectric layer 206C. This may improve an electrical insulating characteristic between the gate electrode 205 and adjacent structures. The third gate dielectric layer 206C is usually fixed to a certain thickness since it serves as a gate insulating layer between the gate electrode 205 and the channel structure 210. However, as a thickness of the first gate dielectric layer 206A disposed between the photoelectric conversion element 203 and the gate electrode 205, and a thickness of the second gate dielectric layer 206B between the floating diffusion layer 214 and the gate electrode 205 are increased, an electrical insulating characteristic may be improved. For example, as thicknesses of the first gate dielectric layer 206A and the second gate dielectric layer 206B are increased, a parasitic capacitance may be decreased, thereby improving a signal to noise ratio characteristic.

Moreover, to further improve an electrical insulating characteristic, the first gate dielectric layer 206A and the second gate dielectric layer 206B may include a low-K material. Herein, 'low-K' means a dielectric constant lower than the dielectric constant of silicon oxide. The third gate dielectric layer 206C contacting the channel structure 210 may include a high-K material. The image sensor in accordance with another embodiment of the present invention described above may facilitate high integration without deterioration of characteristics.

FIG. 7 is a cross-sectional view illustrating an image sensor in accordance with another embodiment of the present invention image sensor. As shown in FIG. 7, a photoelectric conversion element 203 of the image sensor in accordance with another embodiment of the present invention may include a first impurity region 201 and a second impurity region 202. The first impurity region 201 may surround the second impurity region 202. And, a portion of the second impurity region 202 passes through the first impurity region 201 and contacts a channel structure 210.

Here, an image sensor in accordance with still yet embodiment of the present invention may further include a third impurity region 204 formed in a substrate 200, having the same conductivity type as the first impurity region 201 and interposed between the second impurity region 202 and the channel structure 210.

Specifically, the third impurity region 204 may be formed in a surface of the substrate 200 contacting the channel structure and serves to suppress generation of a dark current. Here, the first impurity region 201, which contacts an incident surface S1 and is located opposite to the surface S2 of the substrate 200, may also serve to suppress generation of a dark current. In this case, since the third impurity region 204 has a conductivity type complementary to the second impurity region 202, the third impurity region 204 may preferably have a smaller thickness than the first impurity region 201 contacting the opposite surface S2 of the substrate 200 to transfer carriers between the photoelectric conversion element 203 and the channel structure 210. For example, the third impurity region 204 may have a thickness of 50 nm or less. The image sensor in accordance with another embodiment of the present invention described above may facilitate high integration without deterioration of characteristics.

Figure 8:
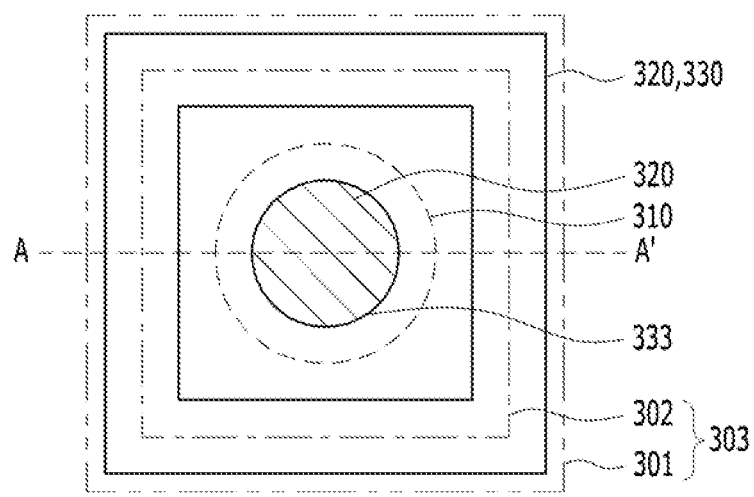
FIG. 8 is a plan view illustrating an image sensor in accordance with yet another embodiment of the present invention.
Figure 9:
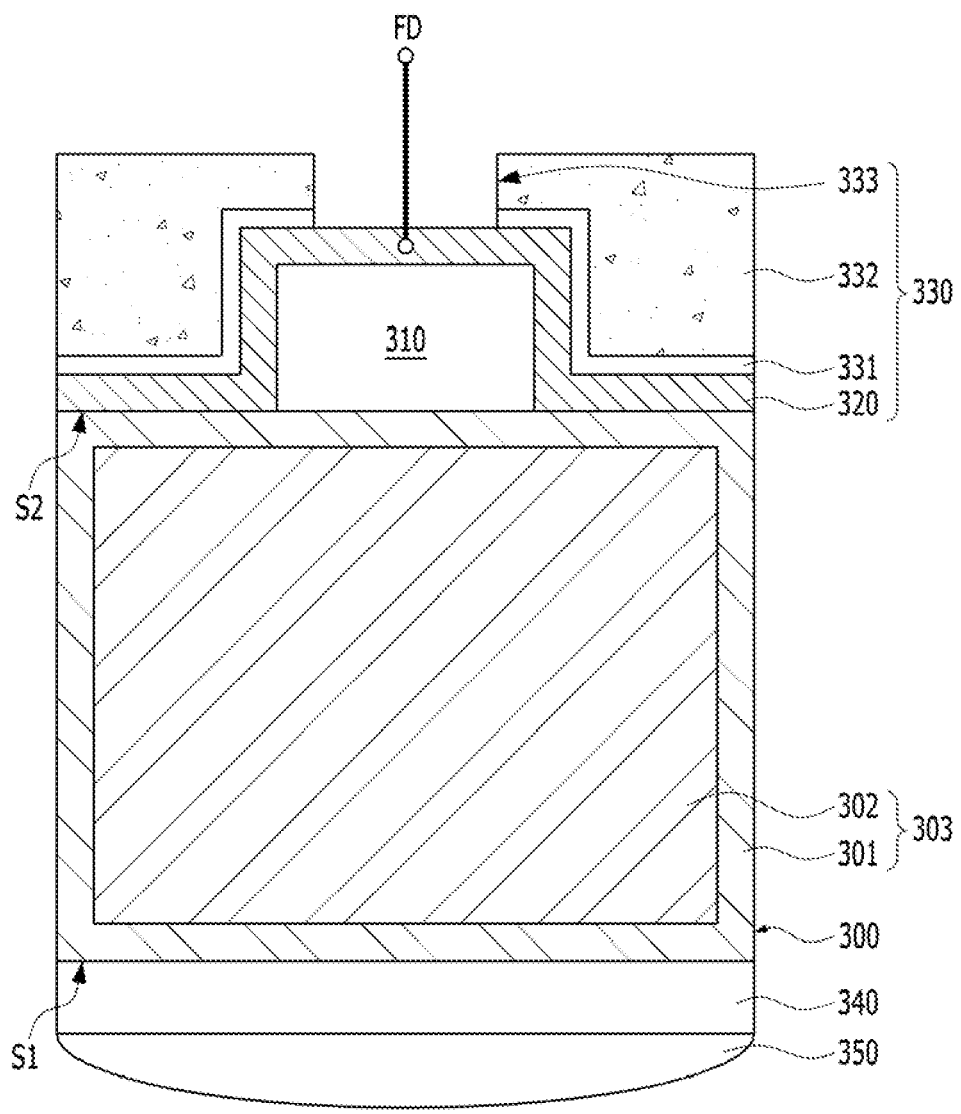
FIG. 9 is a cross-sectional view taken along the line A-A' shown in FIG. 8.
Figure 10:
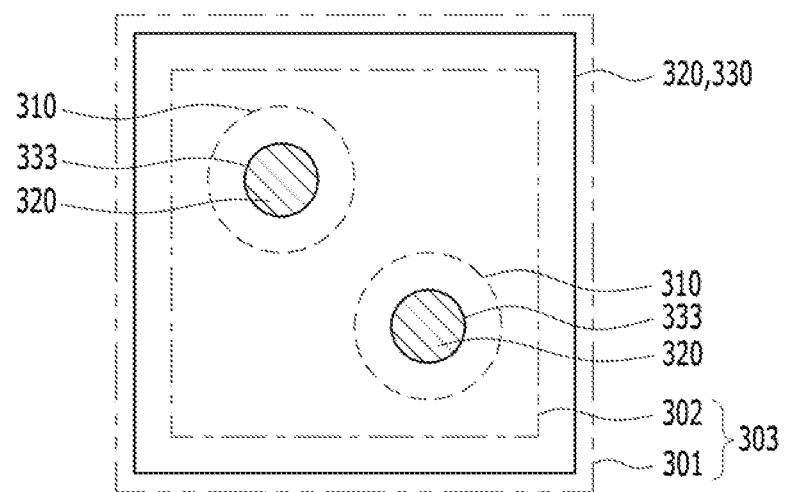
FIG. 10 is a plan view illustrating an image sensor in accordance with yet another embodiment of the present invention.

FIG. 8 is a plan view illustrating an image sensor in accordance with yet another embodiment of the present invention and FIG. 9 is a cross-sectional view taken along the line A-A' shown in FIG. 8. Further, FIG. 10 is a plan view illustrating a modification of an Image sensor in accordance with yet another embodiment of the present invention.

As shown in FIGS. 8 and 9, an image sensor in accordance with an embodiment of the present invention may include a photoelectric conversion element 303 formed in a substrate 300, one or more pillars 310 formed over the photoelectric conversion element 303, a channel layer 320 formed over the pillars 310 so as to contact the photoelectric conversion element 303, and a transfer gate 330 formed over the channel layer 320 and surrounding a side surface of the pillars 310.

In the image sensor in accordance with the embodiment of the present invention, the substrate 300 may include a semiconductor substrate. The semiconductor substrate may be in a single crystal state and include a silicon-containing material. That is, the substrate 300 may include a single crystal silicon-containing material. And, the substrate 300 may be a thin substrate obtained by a thinning process. For example, the substrate 300 may be a thin bulk silicon substrate obtained by a thinning process.

The photoelectric conversion element 303 may include a photodiode. Specifically, the photoelectric conversion element 303 may include a first impurity region 301 and a second impurity region 302. The second impurity region 302 has conductivity complementary to the first impurity region 301. For example, the first impurity region 301 may be a P-type, and the second impurity region 302 may be an N-type. The second impurity region 302 may be formed within the first impurity region 301.

Accordingly, the first impurity region 301 may have a shape surrounding the second impurity region 302. The first impurity region 301 may contact an incident surface S1 and an opposite surface S2, and serve to prevent occurrence of a dark current over a surface of the substrate 300. Moreover, the first impurity region 301 may serve as a junction isolation to isolate adjacent pixels from each other. The second impurity region 302 may have a uniform doping profile in a vertical direction or a gradient profile in which a doping concentration of an impurity is increased along a carrier transport direction. In the latter case, it is possible to more effectively transport a photocharge generated in the photoelectric conversion element 303 to the transfer gate 330. Here, the carrier transport direction may be a direction which extends from the incident surface S1 where an incident light is introduced to the photoelectric conversion element 303 (S1→S2).

The image sensor in accordance with the embodiment of the present invention may include one or more pillars 310 formed over the photoelectric conversion element 303. The pillars 310 may serve to increase a channel length of the transfer transistor by adjusting the height of the pillars 310.

The pillars 310 may have a planar shape of a polygon having three sides or more, a circle or an oval shape. The pillars 310 may have vertical sidewalls or inclined sidewalls. The pillars 310 having inclined sidewalls may have a shape of a frustum of a pyramid. In another embodiment, sidewalls of the pillars 310 may have an uneven structure. The pillars 310 may include an insulating material. For example, the pillars 310 may include oxide, nitride, oxynitride, or a combination thereof.

As shown in FIG. 8, a unit pixel may include one pillar 310. In this case, the pillars 310 may be disposed at a center portion of the photoelectric conversion element 303. This is to efficiently transport a photocharge generated in the photoelectric conversion element 303 to the channel layer 320. In another embodiment, as shown in FIG. 10, a unit pixel may include a plurality of pillars 310. The plurality of pillars 310 are coupled to a floating diffusion (FD). The plurality of pillars 310 may be arranged in a matrix shape. The plurality of pillars 310 may have the same shape as each other or a different shape from each other.

The image sensor in accordance with the embodiment of the present invention may include the transfer gate 330 formed over the photoelectric conversion element 303 and surrounding sidewalls of the pillars 310. Since the transfer gate 330 has a shape surrounding sidewalls of the pillars 310, a vertical channel may be implemented. The transfer gate 330 may have a flat plate shape overlapping the photoelectric conversion element 303. Accordingly, the transfer gate 330 may have a flat plate shape corresponding to the unit pixel. As such, the photoelectric conversion element 303 and the transfer gate 330 are stacked in a vertical direction in the image sensor so that a degree of integration may be increased. The transfer gate 330 may be formed over the opposite surface S2. Accordingly, the transfer gate 330 may also function as a backside reflective layer with respect to the photoelectric conversion element 303. In this case, it is possible to increase quantum efficiency of the photoelectric conversion element 303.

The transfer gate 330 may surround sidewalls of the pillars 310 and a portion of the transfer gate 330 may extend to an upper surface of the pillars 310. That is, the transfer gate 330 may have an opening 333 exposing a portion of the upper surface of the pillars 310. The opening 333 is to provide an electrical contact between the channel layer 320 formed over the upper surface of the pillars 310 and the floating diffusion (FD).

When a plurality of pillars 310 are provided as shown in FIG. 10, the transfer gate 330 may include a plurality of openings 333 corresponding to each of the plurality of pillars 310. A planar shape of the opening 333 may be the same as those of pillars 310. That is, the opening 333 may have a planar shape of a polygon having three sides or more, a circle or an oval shape.

The transfer gate 330 may include a gate dielectric layer 331 and a gate electrode 332 over the gate dielectric layer 331. The gate dielectric layer 331 may have a uniform thickness and include an insulating material. Particularly, the gate dielectric layer 331 may include a high-K material having an insulating characteristic. For example, the gate dielectric layer 331 may include oxide, nitride, oxynitride, or a combination thereof. The gate electrode 332 may include a semiconductor material including silicon or a metallic material.

The image sensor in accordance with the embodiment of the present invention may include the channel layer 320 electrically coupled to the photoelectric conversion element 303 and formed over an exposed surface of the pillars 310. The channel layer 320 may have a reversed-cylinder shape. Alternatively, the channel layer 320 may have such a shape that an end of the channel layer 320 contacting the photoelectric conversion element 303 is extended to the substrate 300 in order to increase a contact area between the photoelectric conversion element 303 and the channel layer 320.

The channel layer 320 extended to the substrate 300 may be disposed between the photoelectric conversion element 303 and the transfer gate 330. That is, the channel layer 320 may be a shape covering the entire opposite surface S2 of the substrate 300 including pillars 310 in the unit pixel. Accordingly, the channel layer 320 may overlap the entire photoelectric conversion element 303.

The channel layer 320 may have a shape contacting only the first impurity region 301 of the photoelectric conversion element 303. Accordingly, the channel layer 320 does not contact with the second impurity region 302 of the photoelectric conversion element 303. Since the channel layer 320 and the first impurity region 301 of the photoelectric conversion element 303 have conductivity types complementary to each other, the first impurity region 301 in contact with the channel layer 320 may have a relatively small thickness so as to facilitate carrier transport from the photoelectric conversion element 303 to the channel layer 320.

The channel layer 320 may include a silicon-containing material. For example, the channel layer 320 may include polysilicon. Specifically, the channel layer 320 may include undoped polysilicon in which an impurity is not doped or P-type polysilicon in which a P-type impurity is doped. In this case, the transfer transistor may be operated in an enhancement mode.

In the image sensor in accordance with the embodiment of the present invention, the channel layer 320 may include polysilicon doped with an N-type impurity. In this case, the transfer transistor may be operated in a depletion mode and improve a dark current characteristic in an off-state. Moreover, the channel layer 320 may have a conductivity type complementary to the first impurity region 301 of the photoelectric conversion element 303. The channel layer 320 and the first impurity region 301 may be junction-isolated in an equilibrium state.

Specifically, polysilicon has many trap sites. When polysilicon is employed as the channel layer 320, the trap sites may function as a source of generating a dark current. To improve a dark current characteristic, it is preferable to employ polysilicon doped with an impurity rather than undoped polysilicon as the channel layer 320. This is because the trap sites may be eliminated by using the doped impurity. As a doping concentration of the impurity is increased, more trap sites may be eliminated and a dark current characteristic may be more effectively improved.

However, in a case of applying polysilicon doped with a P-type impurity as the channel layer 320, when a doping concentration of the impurity is increased, a threshold voltage of the transfer transistor is also increased and thus gate control may be decreased. In a case that polysilicon doped with an N-type impurity is applied as the channel layer 320 and the transfer transistor is operated in a depletion mode, the transfer gate 330 may be in an off-state. That is, a dark current generated in the channel layer 320 during an integration time that a photocharge is generated in the photoelectric conversion element 303 in response to an incident light may be extracted to the floating diffusion (FD). Here, due to the first impurity region 301 of the photoelectric conversion element 303 having a conductivity type complementary to the channel layer 320, a photocharge generated in the photoelectric conversion element 303 is not extracted to the channel layer 320 and is accumulated in the photoelectric conversion element 303.

In an on-state of the transfer gate 330, an electric field of the channel layer 320 is extended to the photoelectric conversion element 303 and thus the channel layer 320 may be electrically coupled to the photoelectric conversion element 303. After that, a photocharge accumulated in the photoelectric conversion element 303 may be transferred to the floating diffusion (FD) through the channel layer 320.

The image sensor in accordance with the embodiment of the present invention may include a color filter layer 340 opposite to the transfer gate 330 and formed over the incident surface S1 where an incident light is introduced into the photoelectric conversion element 303 and a light condensing member 350 formed over the color filter layer 340. The color filter layer 340 may serve to separate colors and include a red filter, a green filter, a blue filter, a cyan filter, a yellow filter, a magenta filter, a white filter, a black filter, an IR cutoff filter, etc. The light condensing member 350 may include a digital lens or a hemispherical lens.

The present technology may provide an image sensor facilitating high integration without deterioration of device characteristics. Particularly, a dark current characteristic may be effectively improved.

The image sensor in accordance with an embodiment of the present invention may be used in various electronic devices or systems. Hereafter, a camera including an image sensor in accordance with an embodiment of the present invention will be described with reference to FIG. 11.

Figure 11:
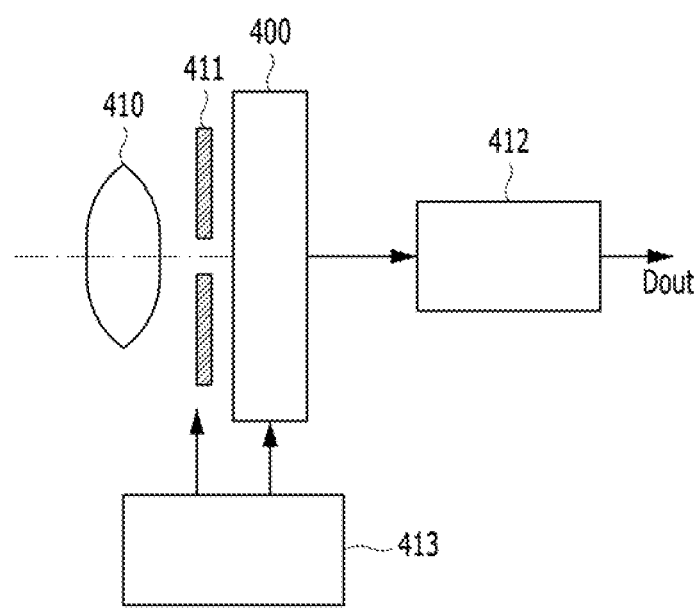
FIG. 11 is a diagram schematically illustrating an electronic device including an image sensor shown in FIG. 1.

FIG. 11 is a diagram schematically illustrating an electronic device including an image sensor shown in FIG. 1. Referring to FIG. 11, the electronic device including the image sensor in accordance with an embodiment of the present invention may be a camera capable of taking a still image or moving image. The electronic device may include an optical system or optical lens 410, a shutter unit 411, a driving unit 413 for controlling/driving the image sensor 400 and the shutter unit 411, and a signal processing unit 412.

The optical system 410 may guide image light from an object to the pixel array 100 of the image sensor 400. The optical system 410 may include a plurality of optical lenses. The shutter unit 411 may control the light irradiation period and the light shield period for the image sensor 400. The driving unit 413 may control a transmission operation of the image sensor 400 and a shutter operation of the shutter unit 411. The signal processing unit 412 may process signals outputted from the image sensor 400 in various manners. The processed image signals Dout may be stored in a storage medium such as a memory or outputted to a monitor or the like.

As described above, the image sensor can facilitate high integration without deterioration of characteristics of the image sensor.

Although various embodiments have been described for illustrative purposes, it will be apparent to those skilled in the art that various changes and modifications may be made without departing from the spirit and scope of the invention as defined in the following claims.

What is claimed is:

1. An image sensor, comprising:
a photoelectric conversion element comprising a first impurity region and a second impurity region, wherein the first impurity region contacts a first surface of a substrate, wherein the second impurity region has conductivity complementary to the first impurity region and is formed in the substrate and below the first impurity region;
a pillar formed over the photoelectric conversion element;
a transfer gate formed over the photoelectric conversion element to surround the pillar; and
a channel layer formed between the transfer gate and the pillar and contacting the photoelectric conversion element,
wherein the channel layer contacts the first impurity region and has the same conductivity as the second impurity region.

2. The image sensor of claim 1, further comprising:
a color filter layer formed over an incident surface of the substrate, wherein the incident surface of the substrate is opposite to the first surface of the substrate, wherein an incident light is introduced through the color filter layer and travels to the photoelectric conversion element; and
a light condensing member formed over the color filter layer.

3. The image sensor of claim 1, wherein the first impurity region surrounds the second impurity region.

4. The image sensor of claim 1, wherein the first impurity region includes a first portion contacting the channel layer and a second portion except for the first portion, and the first portion has a thickness smaller than that of the second portion.

5. The image sensor of claim 1, wherein the second impurity region has a gradient doping profile so that a doping concentration of the second impurity region gradually increases along a carrier transport direction.

6. The image sensor of claim 1, wherein the pillar is a polygon pillar, a round pillar, or an oval pillar.

7. The image sensor of claim 1, wherein the pillar has a vertical sidewall, an inclined sidewall, or an unevenly-shaped sidewall.

8. The image sensor of claim 1, wherein the pillar comprises an insulating material.

9. The image sensor of claim 1, wherein the channel layer overlaps the entire photoelectric conversion element.

10. The image sensor of claim 1, wherein the channel layer comprises doped polysilicon.

11. The image sensor of claim 1, wherein the transfer gate comprises an opening exposing the channel layer.

* * * * *